US007654862B2

(12) United States Patent
Liao et al.

(10) Patent No.: US 7,654,862 B2
(45) Date of Patent: Feb. 2, 2010

(54) IC PACKAGE HAVING IMPROVED STRUCTURE

(75) Inventors: Fang-Chu Liao, Tu-cheng (TW); Chun-Yi Chang, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/075,154

(22) Filed: Mar. 10, 2008

(65) Prior Publication Data

US 2008/0220627 A1 Sep. 11, 2008

(30) Foreign Application Priority Data

Mar. 9, 2007 (CN) ........................ 2007 2 0035282

(51) Int. Cl.
*H05K 1/00* (2006.01)

(52) U.S. Cl. ...................................................... 439/526

(58) Field of Classification Search ................... 439/66, 439/68, 526, 330, 71, 525
See application file for complete search history.

(56) References Cited

U.S. PATENT DOCUMENTS

| | | | | |
|---|---|---|---|---|
| 5,066,245 | A * | 11/1991 | Walker | 439/526 |
| 6,733,304 | B1 * | 5/2004 | Liao | 439/66 |
| 6,796,805 | B2 * | 9/2004 | Murr | 439/71 |
| 7,128,580 | B2 * | 10/2006 | Liao et al. | 439/71 |

* cited by examiner

*Primary Examiner*—Edwin A. Leon
(74) *Attorney, Agent, or Firm*—Andrew C. Cheng; Wei Te Chung; Ming Chieh Chang

(57) ABSTRACT

An electrical connector assembly comprises an insulative housing having a base, with a mating interface, and a mounting interface corresponding to the mating face. The base has peripheral walls extending upwardly from the mating face. A plurality of contacts arranged in the base of the insulative housing. At least a pair of cantilevered push fingers formed on two adjacent walls for pushing the integrated circuit module toward opposing walls. At least a support device formed on the bottom of the push finger.

14 Claims, 4 Drawing Sheets

8 7 72 77 76 762 761 73 71 75

7 IV 761 763 762 761 763 78 IV

IC PACKAGE HAVING IMPROVED STRUCTURE

BACKGROUND OF THE INVENTION

1. Field of the Invention

The present invention relates to an electrical connector, and more particularly, to an electrical connector for well supporting when mounted on the printed circuit board.

2. Description of the Prior Art

Connector socket has been widely used in electrically mounting an IC chip to a motherboard.

U.S. Pat. No. 5,722,848 issued to Lai on Mar. 3, 1998 discloses a typical connector socket, and which is generally referred to as ZIF socket. In generally, the socket generally includes a base with a plurality of contacts assembled therein, and a cover moveably attached to the base. A lever along with a cam mechanism is arranged between the base and cover so as to drive the cover from a first position to a second position. When the lever is located in a vertical position, the cover is located at the first position, in which a hole in the cover is completely in align with a corresponding passageway in the base. In this position, a pin leg of a CPU can be inserted from the cover into the passageway without any engagement with the contact. When the CPU is properly seated on the cover, then the lever is moved from the vertical position to a horizontal position, and simultaneously driving the cover from the first position to the second position. During this process, the pin leg of the CPU is then in contact with the contact within the base.

U.S. Pat. No. 7,001,197 issued to Shirai on Feb. 21, 2006 discloses another type of connector socket, and which can be generally called LGA socket. As clearly shown in Figures, the socket generally includes a metal stiffener with a housing securely supported therein. Then a metal clip is pivotally assembled to the stiffener. On the other hand, a clip is pivotally assembled to the other side of the stiffener and when the clip is closed to the stiffener, the lever having a cam can lock the clip to a closed position. By this arrangement, if before the clip is closed, and a CPU is seated on the housing, then the clip will tightly press the CPU toward the housing ensuring proper electrical connection therebetween.

There is another type connector socket other those disclosed by Lai and Shirai. The socket generally includes a base with a plurality of contacts assembled therein. Different from Lai and Shirai as those sockets are soldered onto the motherboard, this socket is mounted onto the motherboard by compression-type of contact, or LGA type contact. In other word, when an IC chip is seated on the base, a fixture mounted on the motherboard will press against the IC chip so as to create an electrical path from IC chip to the contacts of the socket, and from the socket to the motherboard. No solder is used in this application.

The body further includes side walls extending upward from the base. If walls are numbered from 1st, 2nd, 3rd and 4th, then any two adjacent walls are used as a datum plane, while the other two adjacent walls, which are generally diagonal to those two datum plane. In those second pair walls, each is provided with a push finger projecting outward of 3rd and 4th wall providing biasing force toward opposite datum plane. For easy illustration, if 1st and 2nd walls are used as datum plane, then push fingers are formed on 3rd and 4th walls. The push finger formed on 3rd wall provides a biasing force toward 1st wall, while the push finger on 4th wall provides biasing force toward 2nd wall.

In use, IC chip is mounted onto the housing by firstly having two side wall of the IC chip link against 3rd and 4th walls such that the push fingers are pushed back to 3rd and 4th walls, and then the other sidewalls of the IC chip is seated within the housing. After the IC chip is well seated, the push fingers from 3rd and 4th walls will drive the IC chip toward 1st and 2nd walls so as to ensure proper alignment between pads under the IC chip and contact tips within the socket.

In generally, the push finger is integrally formed with the 3rd and 4th walls, while they are cantilevered from a part of the walls. As it is cantilevered, it is vulnerable to break if care is not taken and excessive downward force is applied to a tip of the push fingers. As a result, a potential risk of breakage could be encountered. And therefore, improvement may be needed.

SUMMARY OF THE INVENTION

Accordingly, an object of the present invention is to provide an electrical connector for well establishing an electrical connection between an IC chip to an printed circuit board.

In order to achieve the object set forth, an electrical connector assembly comprises an insulative housing having a base, with a mating interface, and a mounting interface corresponding to the mating face. The base has peripheral walls extending upwardly from the mating face. A plurality of contacts arranged in the base of the insulative housing. At least a pair of cantilevered push fingers formed on two adjacent walls for pushing the integrated circuit module toward opposing walls. At least a support device formed on the bottom of the push finger.

DESCRIPTION OF PREFERRED EMBODIMENT OF THE INVENTION

Reference will now be made to the drawings to describe the present invention in detail.

Figure 1:
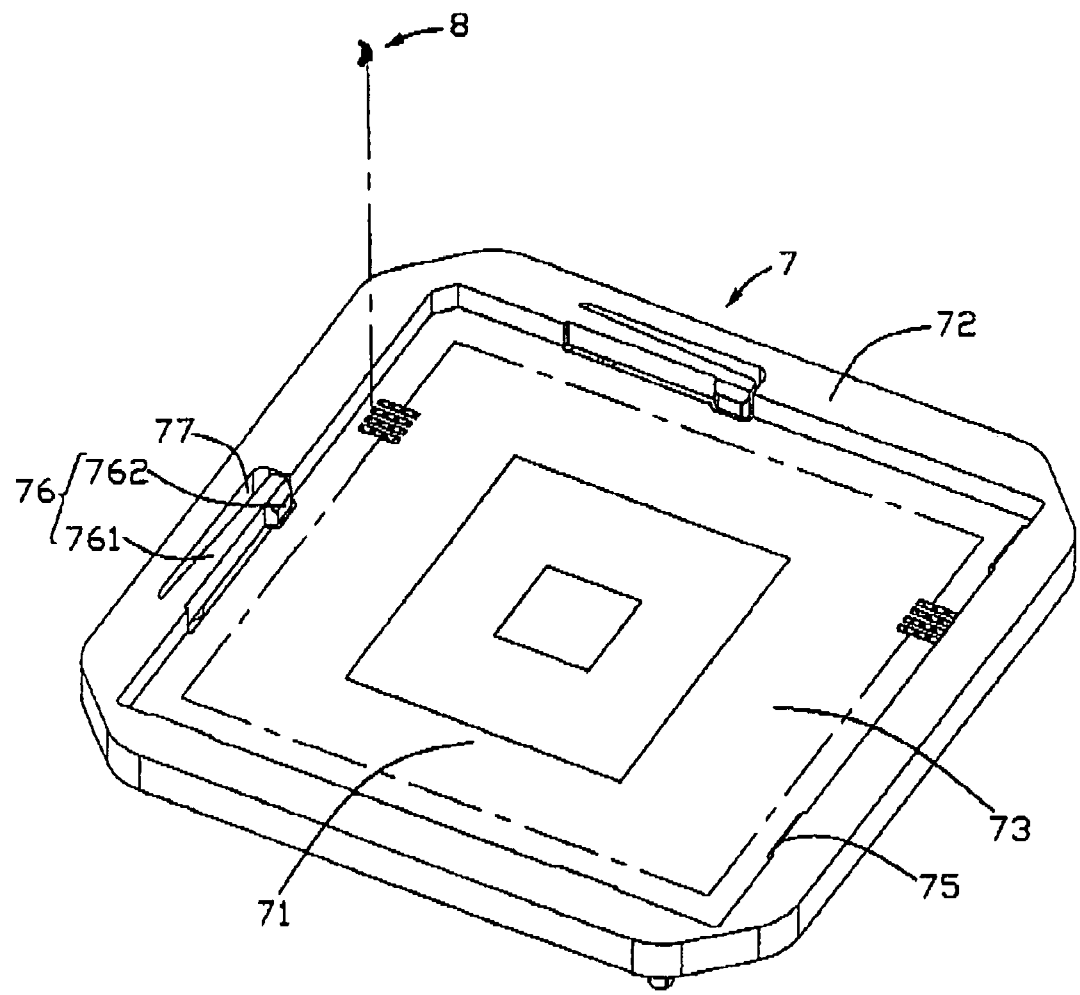
FIG. 1 is an exploded view of an electrical connector in accordance with a preferred embodiment of the present invention.

Referring to FIG. 1, depicts an embodiment of an electrical connector, the electrical connector is adapt for electrically connecting an IC chip to a circuit substrate such as a printed circuit board (PCB). The electrical connector comprises an insulative housing 7 and a plurality of contacts 8 received in insulative housing 7.

The insulative housing 7 having a base 71, with a mating interface, and a mounting interface corresponding to the mating face. The base 71 further includes peripheral walls 72 extending upwardly from thereon, the base 71 and the peripheral walls 72 jointly defining a receiving space 73 therebetween. A plurality of passageways extending from the mating interface toward the mounting interface in the receiving space, and with a plurality of contacts 8 arranged in the passageways. The peripheral walls 72 are numbered from first, second, third, fourth, then any two adjacent walls are used as a datum plane, while the other two adjacent walls, which are generally diagonal to those two datum plane. For easy illustration, if the third and fourth walls are used as datum plane, then a plurality of holes 77 are formed on the first and second walls and extending to the mounting interface. Each holes 77 extending a cantilevered push finger 76 from each end of the hole 77. The cantilevered push finger 76 can be integrally formed with the wall of the insulative housing 7, and also can separated from the wall of the insulative housing 7. The cantilevered push finger 76 includes a spring arm 761 extending from the holes 77 and a connect portion 762 at the free end of the spring arm 761 extending beyond the wall. Each hole 77 has a corresponding shape with the cantilevered push finger 76.

Figure 2:
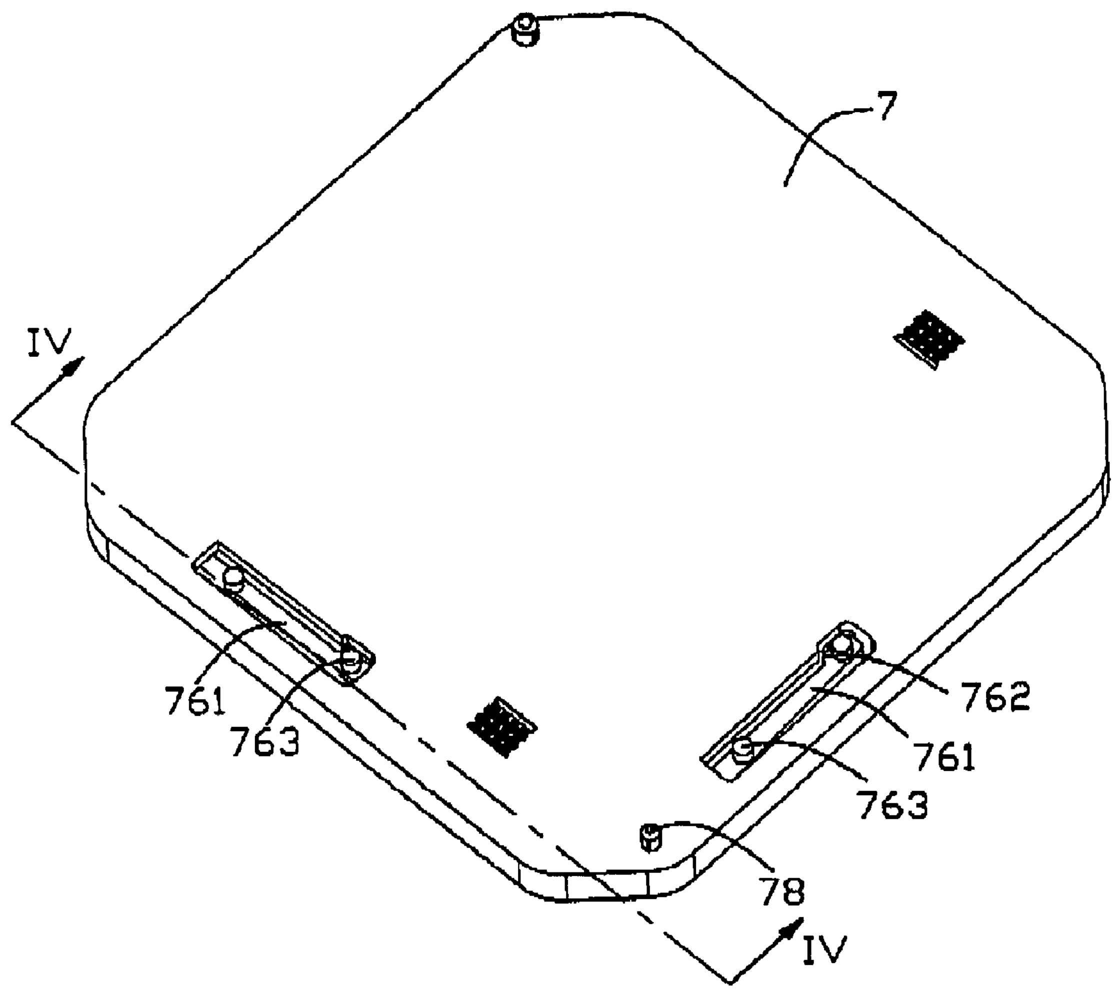
FIG. 2 is another perspective view of the present invention of FIG. 1.
Figure 3:
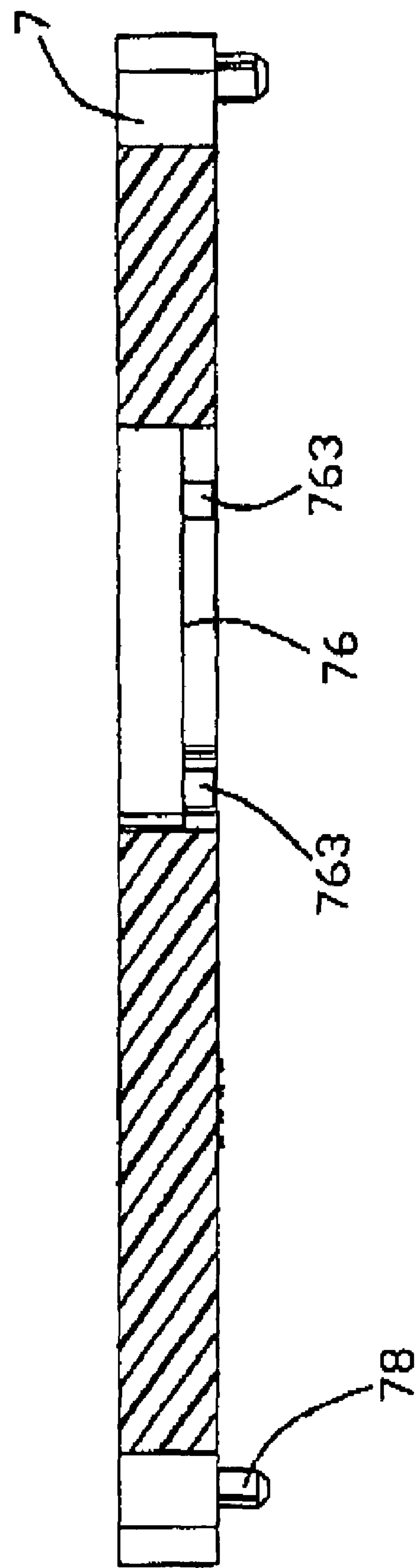
FIG. 3 is a cross section view along with IV-IV of the present invention.

Referring to FIG. 2 to FIG. 3, support devices are defined on the bottom of the cantilevered push finger 76. The support device is includes at least a post 763. The posts 763 are positioned at the bottom of the root and at the free end of the spring arm 761 of the cantilevered push finger 76. The posts 763 are used to well support when the electrical connector is mounted on the printed circuit board. At the mounting interface defined a plurality of locating pins 78 for locating the electrical connector to the printed circuit board.

Figure 4:
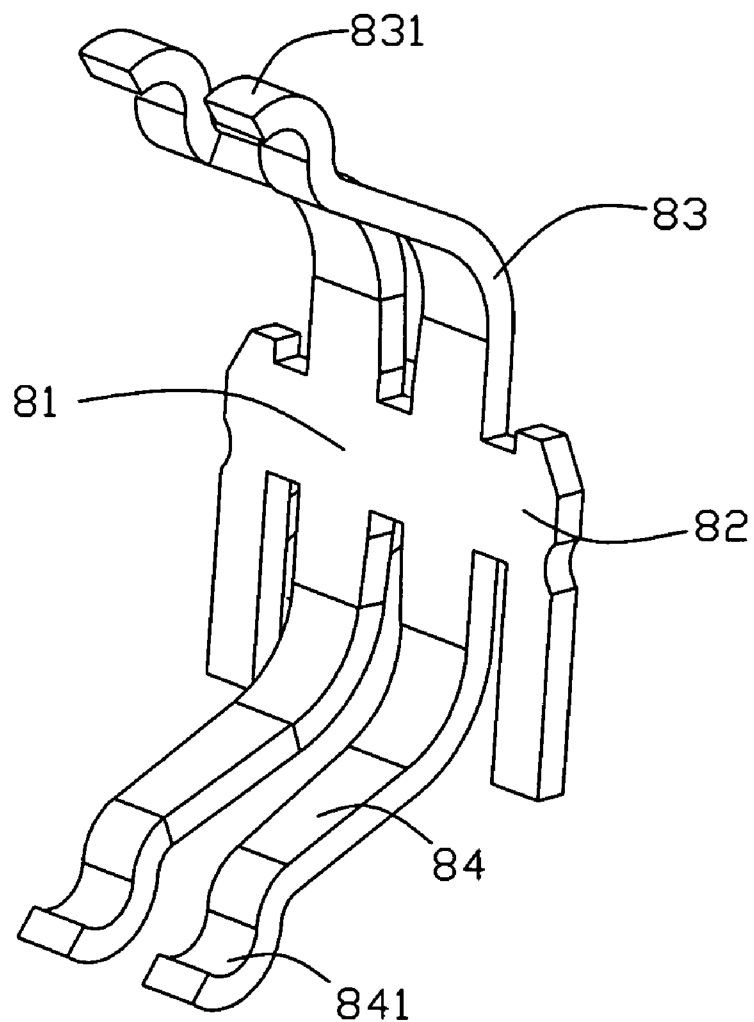
FIG. 4 is a contact made in accordance with present invention.

Referring to FIG. 4, the contact 8 includes a body portion 81, two tip portions 83 extending from the body portion 81 in a direction toward the mating interface and two tail portions 84 extending from the body portion 81 in a direction toward the mounting interface. Retention portion 82 formed on the base for securely positioning the contact 8 within the passageway. Both the tip portions 83 and the tail portions 84 have the contacting engaging portions 831, 841 electrically engaging with the IC chip and the printed circuit board.

In the assembly process, the insulative housing 7 is firstly mounted on the printed circuit board by the locating pins 78, then the IC chip is mounted on the insulative housing 7. When the IC chip disposed on the insulative housing 7, the cantilevered push fingers 76 are pushed back to the first and second walls and are pressed downwardly to the printed circuit board synchronously. After the IC chip is well seated, the cantilevered push fingers 76 from the first and the second walls will drive the IC chip toward the third and the fourth walls so as to ensure proper alignment between pads under the IC chip and contact tips within the electrical connector.

When the IC chip mounted on the insulative housing 7, the cantilevered push fingers 76 will endure excessive downward force, then the cantilevered push fingers 76 will vulnerable to break. In this invention, a plurality of support devices formed on the bottom of the cantilevered push finger 76, and the support devices will provide a support force to the cantilevered push finger 76 for avoiding the cantilevered push finger 76 to break. It is noted that the support device is to engage other means for providing an upward force upon the push finger 76, for resisting the aforementioned downward force from the IC chip, on a position other than a joint position where the push finger 76 extends from the corresponding peripheral wall 72. And in this embodiment, such means for engagement with the support device is the punted circuit board on which the housing 7 is seated.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector for electrically connecting an IC chip to a printed circuit board, comprising:

an insulative housing having a base, with a mating interface abutting against the IC chip, and a mounting interface abutting against the printed circuit board and corresponding to the mating face, peripheral walls extending upwardly from the base, and jointly defining a receiving space therebetween;

a plurality of passageways extending from the mating interface toward the mounting interface, and with a plurality of contacts arranged in the passageways;

at least a pair of cantilevered push fingers formed on two adjacent walls for pushing the IC chip toward opposing walls, the push fingers and the mounting interface defining a space therebetween; and at least a support device extending from the push finger to the mounting interface and located in the space.

2. The electrical connector as claimed in claim 1, wherein the said peripheral walls are the first wall, the second wall, the third wall and the forth wall.

3. The electrical connector as claimed in claim 2, wherein a plurality of holes formed on the first and second walls and extending to the mounting interface, and the cantilevered push finger includes a spring arm extending from one end of the hole and a connect portion extending from the free end of the spring arm and is beyond the wall, the hole has a corresponding shape with the cantilevered push finger.

4. The electrical connector as claimed in claim 3, wherein the cantilevered push fingers defined on the first wall providing a biasing force toward the third wall.

5. The electrical connector as claimed in claim 4, another cantilevered push fingers defined on the second wall providing a biasing force toward the forth wall.

6. The electrical connector as claimed in claim 1, wherein the support device includes at least a post.

7. The electrical connector as claimed in claim 6, wherein the cantilevered push finger is provided with at the free end.

8. The electrical connector as claimed in claim 7, wherein said posts are positioned at the bottom of the root and at the free end of the spring arm of the cantilevered push finger respectively.

9. The electrical connector as claimed in claim 1, wherein the cantilevered push finger is integrally formed with the wall of the insulative housing.

10. An electrical connector system comprising:

an IC chip;

a socket assembly comprising:

an insulative housing having a base and peripheral walls extending from peripheral of the base and defining an inner cavity therebetween which receives said IC chip therein, a plurality of contacts extending from said base within said inner cavity, and each having a contact engaging portion extending into the inner cavity; and at least one of the peripheral wall provided with a cantilevered pushing finger driving the IC chip toward the opposite peripheral wall, the pushing finger having posts positioned at the bottom of the root and the free end thereof respectively.

11. An electrical connector assembly comprising:

an insulative housing including a bottom wall and a plurality of peripheral walls commonly defining an upward receiving cavity;

a plurality of terminals disposed in the bottom wall with contacting portions extending upwardly into the receiving cavity for receiving an IC (Integrated Circuit) chip; and at least one resilient push finger unitarily formed on one of said peripheral walls and extending essentially along a first transverse direction along the corresponding one of said peripheral walls with an urging head transversely extending into the receiving cavity in a second transverse direction perpendicular to said first transverse direction; wherein a main body of said push finger is essentially spaced from a bottom face of the housing while being equipped with an abutment device with an abutment face closely around said bottom face so as to support the push finger when said push finger is transversely urged; and wherein said abutment device engages means to provide an upward force on the push finger for resisting a downward force due to downward loading IC chip into the receiving cavity, at a position other than a join position where the push finger extends from the corresponding peripheral wall.

12. The electrical connector assembly as claimed in claim 11, wherein said abutment device is a post unitarily extending downwardly from a bottom surface of the push finger and dimensioned to be seated upon a top surface of a printed circuit board on which the housing is mounted.

13. The electrical connector assembly as claimed in claim 12, wherein said housing further includes another post unitarily extending downwardly from the bottom face of the housing and dimensioned to downwardly extend beyond said top surface of the printed circuit board.

14. The electrical connector assembly as claimed in claim 13, wherein said post is moveable along with the push finger while said another post is not.

* * * * *